US010622330B2

(12) United States Patent
Sun et al.

(10) Patent No.: US 10,622,330 B2
(45) Date of Patent: Apr. 14, 2020

(54) FLEXIBLE DISPLAY PANEL AND PREPARATION METHOD THEREOF, FLEXIBLE DISPLAY DEVICE

(71) Applicant: BOE Technology Group Co., LTD, Beijing (CN)

(72) Inventors: Tao Sun, Beijing (CN); Liqiang Chen, Beijing (CN); Hongli Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 7 days.

(21) Appl. No.: 15/959,584

(22) Filed: Apr. 23, 2018

(65) Prior Publication Data
US 2019/0067240 A1    Feb. 28, 2019

(30) Foreign Application Priority Data

Aug. 23, 2017   (CN) .......................... 2017 1 0728987

(51) Int. Cl.
*H01L 23/00* (2006.01)
*H01L 51/00* (2006.01)
*H01L 23/498* (2006.01)

(52) U.S. Cl.
CPC ............ *H01L 24/81* (2013.01); *H01L 23/498* (2013.01); *H01L 23/562* (2013.01); *H01L 24/14* (2013.01);
(Continued)

(58) Field of Classification Search
CPC ......... H01L 24/17; H01L 24/73; H01L 24/81; H01L 51/0097; H01L 24/14; H01L 24/16;
(Continued)

(56) References Cited

U.S. PATENT DOCUMENTS

2001/0004944 A1* 6/2001 Nakamura ........... H05K 3/3484
                                                         174/262
2010/0320596 A1* 12/2010 Eom ..................... H01L 21/486
                                                         257/737
(Continued)

FOREIGN PATENT DOCUMENTS

CN           1641875 A       7/2005
CN         101118885 A       2/2008
(Continued)

OTHER PUBLICATIONS

Chinese Office Action in corresponding Chinese Patent Application No. 201710728987.2 dated Apr. 22, 2019 (an English translation attached hereto). 18 pages.

*Primary Examiner* — Dale E Page
*Assistant Examiner* — Quovaunda Jefferson
(74) *Attorney, Agent, or Firm* — Leason Ellis LLP

(57) ABSTRACT

A flexible display panel, a preparation method thereof and a flexible display device are provided. The flexible display panel includes a flexible substrate; a back protective film arranged on a back surface of the flexible substrate; an adhesive layer arranged between the flexible substrate and the back protective film; and a support structure arranged in the adhesive layer between the flexible substrate and the back protective film and in a position corresponding to each of integrated circuit bumps, the support structure being configured to support the integrated circuit bumps in the adhesive layer.

14 Claims, 5 Drawing Sheets

(52) U.S. Cl.
CPC ............. *H01L 24/17* (2013.01); *H01L 24/32*
(2013.01); *H01L 24/73* (2013.01); *H01L 24/83*
(2013.01); *H01L 51/0097* (2013.01); *H01L
24/16* (2013.01); *H01L 24/27* (2013.01); *H01L
2224/14135* (2013.01); *H01L 2224/16227*
(2013.01); *H01L 2224/17135* (2013.01); *H01L
2224/27334* (2013.01); *H01L 2224/32225*
(2013.01); *H01L 2224/73204* (2013.01); *H01L
2224/81007* (2013.01); *H01L 2224/81191*
(2013.01); *H01L 2224/81903* (2013.01); *H01L
2224/83007* (2013.01); *H01L 2224/83192*
(2013.01); *H01L 2224/83203* (2013.01); *H01L
2224/83851* (2013.01); *H01L 2251/5338*
(2013.01)

(58) Field of Classification Search
CPC ......... H01L 24/27; H01L 24/32; H01L 24/83;
H01L 24/562; H01L 23/498; H01L
224/73204; H01L 224/17135; H01L
224/16227; H01L 224/32225; H01L
224/27334; H01L 224/14135; H01L
224/83007; H01L 224/81903; H01L
224/83192; H01L 224/83203; H01L
224/83851; H01L 2251/5338
See application file for complete search history.

(56) References Cited

U.S. PATENT DOCUMENTS

| | | | |
|---|---|---|---|
| 2011/0019370 A1* | 1/2011 | Koh | ................... H01L 21/561 361/749 |
| 2012/0220081 A1 | 8/2012 | Tsai | |
| 2014/0008794 A1* | 1/2014 | Park | ................ H01L 23/49816 257/738 |
| 2018/0277572 A1 | 9/2018 | Yu | |

FOREIGN PATENT DOCUMENTS

| | | | | |
|---|---|---|---|---|
| CN | 102651323 A | 8/2012 | | |
| CN | 205789982 U | 12/2016 | | |
| CN | 106952887 A | 7/2017 | | |
| JP | 2005317799 A | * 11/2005 | ............ | H01L 24/97 |
| JP | 2010266344 A | * 11/2010 | | |
| JP | 2015046264 A | 3/2015 | | |

\* cited by examiner

13

FLEXIBLE DISPLAY PANEL AND PREPARATION METHOD THEREOF, FLEXIBLE DISPLAY DEVICE

CROSS REFERENCE TO RELATED APPLICATIONS

The present application entitled "Flexible Display Panel and Preparation Method thereof, Flexible Display Device" claims priority of Chinese Patent Application No. 201710728987.2 filed on Aug. 23, 2017 to SIPO, the disclosure of which is incorporated herein by reference in its entirety as part of the present application.

TECHNICAL FIELD

Embodiments of the present disclosure relate to a flexible display panel, a preparation method thereof and a flexible display device.

BACKGROUND

In recent years, flexible display devices have become more and more common in the display market, and attract consumers' attention. Development and application of the flexible display subverted a concept that display can only be fixed to one flat panel in the past, and the flexible display has demonstrated various market application prospects due to advantages, such as thinness, flexibility, deformation and customizability, and have emerged in fields, such as wearable devices, transparent displays, household electrical appliances and smart phones.

Technologies to realize the flexible display can be classified into two aspects: a front-panel technology and a back-panel technology. The front-panel technology of the flexible display has a certain compatibility with the front-panel technology of the flat panel display, and the mass production degree is high; however, the back-panel technology of the flexible display is difficult to be compatible with a module technology of the original flat panel display technology after the glass substrate is taken down, and it is difficult to develop it on a flexible substrate.

SUMMARY

Embodiments of the present disclosure relate to a flexible display panel, a preparation method thereof and a flexible display device At least one embodiment of the present disclosure provides a flexible display panel, comprising a flexible substrate; a back protective film arranged on a back surface of the flexible substrate; an adhesive layer between the flexible substrate and the back protective film; and a support structure arranged in the adhesive layer between the flexible substrate and the back protective film and in a position corresponding to each of integrated circuit bumps, the support structure being configured to support the integrated circuit bump in the adhesive layer.

For example, the support structure is a supporting bar.

For example, a plurality of the supporting bars are arranged corresponding to each of the integrated circuit bumps, the plurality of the supporting bars being arranged in parallel substantially.

For example, a plurality of the supporting bars are arranged corresponding to each of the integrated circuit bumps, the plurality of the supporting bars being intersected with each other to form a grid structure.

For example, a plurality of the integrated circuit bumps are arranged along a pattern separately, and the supporting bars are arranged along the pattern.

For example, the plurality of the supporting bars are arranged in parallel substantially.

For example, each of the supporting bars comprises a plurality of sub-supporting bars intersected with each other, the plurality of the sub-supporting bars of at least one of the supporting bars extending and being intersected with other supporting bars, so as to form grids at intersecting regions.

For example, each of the supporting bars comprises a plurality of sub-supporting bars intersected with each other, to form an entire layer of grid structure between the flexible substrate and the back protective film.

For example, each grid of the entire layer of grid structure has a same size.

For example, a plurality of the integrated circuit bumps are arranged along a pattern separately and the supporting bars are arranged along the pattern.

At least one embodiment of the present disclosure also provides a flexible display device, comprising the flexible display panel.

At least one embodiment of the present disclosure also provides a preparation method of the flexible display panel, comprising: forming a back protective film including a support structure and an adhesive layer, the support structure being formed in a position corresponding to each of the integrated circuit bumps; and pasting the back protective film on the back surface of the flexible substrate.

For example, forming the support structure on the back protective film; applying an adhesive layer on the support structure; procuring the adhesive layer to form an adhesive tape-like layer; and pasting the adhesive tape-like layer on the flexible substrate.

For example, the support structure is formed by one of inkjet printing process, dripping process, or screen printing process.

At least one embodiment of the present disclosure also provides a preparation method of the flexible display panel, comprising: forming the support structure on a back surface of the flexible substrate, the support structure being formed in a position corresponding to each of the integrated circuit bumps; and pasting a back protective film with an adhesive layer on the back surface of the flexible substrate provided with the support structure.

BRIEF DESCRIPTION OF THE DRAWINGS

Embodiments of the present disclosure will be described in more detail below with reference to accompanying drawings to allow an ordinary skill in the art to more clearly understand embodiments of the present disclosure, in which:

FIG. 2b is a cross-sectional view along A-A' in FIG. 2a;

DETAILED DESCRIPTION

Hereinafter, technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any creative work, which shall be within the scope of the disclosure.

Unless otherwise defined, all the technical and scientific terms used herein have the same meanings as commonly understood by one of ordinary skill in the art to which the present disclosure belongs. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," "front," "back," or the like are only used to indicate relative position relationship, and when the position of the object which is described is changed, the relative position relationship may be changed accordingly.

Figure 1:
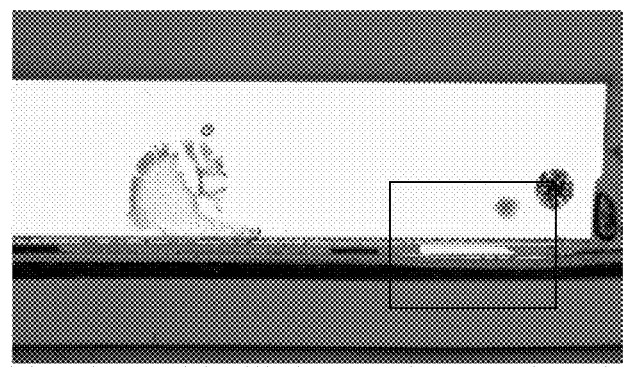
FIG. 1 is a photograph of a flexible display panel in a bonding position.

A back-panel technology includes two ways. One way is that, a glass is cut after a front-panel is pasted with a film, a circuit bonding is performed on the glass, and then the glass is removed, and a film and a functional film are pasted on a back surface of a flexible substrate; the other way is that: after a front-panel is pasted with a film, a large area of glass is removed and a back surface of a flexible substrate is pasted with a film, the glass is cut, and a circuit bonding is performed on the flexible substrate after cutting, then a functional film is pasted on the back surface. One of differences between the two ways is whether a bonding process is performed on the glass or on the flexible plastic substrate. The second way requires heating during the circuit bonding; when the circuit bonding is performed, the flexible substrate includes a plastic substrate, a back protective film, and an adhesive for connecting the plastic substrate and the back protective film, and these various materials have different thermal expansion coefficients and deformations under pressure, especially, the adhesive has obvious deformation and expansion under heating and pressure, and thus, the adhesive in a position for crimping with an integrated circuit (IC) bump region may have thinning and depressing regions, an adhesive in a position without bump may be squeezed into a depression such that the adhesive in this region is thickened, eventually, wrinkles would be occur in the back protective film, as shown in the black box in FIG. 1, resulting in poor crimping of metal particles in the circuit bonding, or a disconnection at the edge of the IC.

Hereinafter, the IC bump may refer to circuit pins connected with an external circuit (e.g., a metal lead of a flexible substrate) on an integrated circuit (IC).

Embodiment I

Figure 2A:
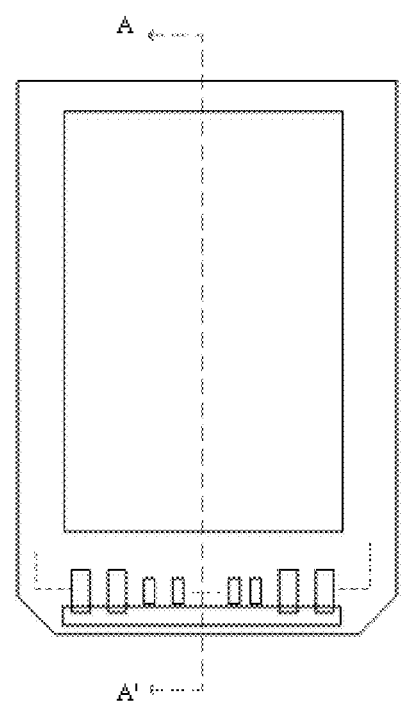
FIG. 2a is a top view of a flexible display panel provided by an embodiment of the present disclosure.
Figure 2B:
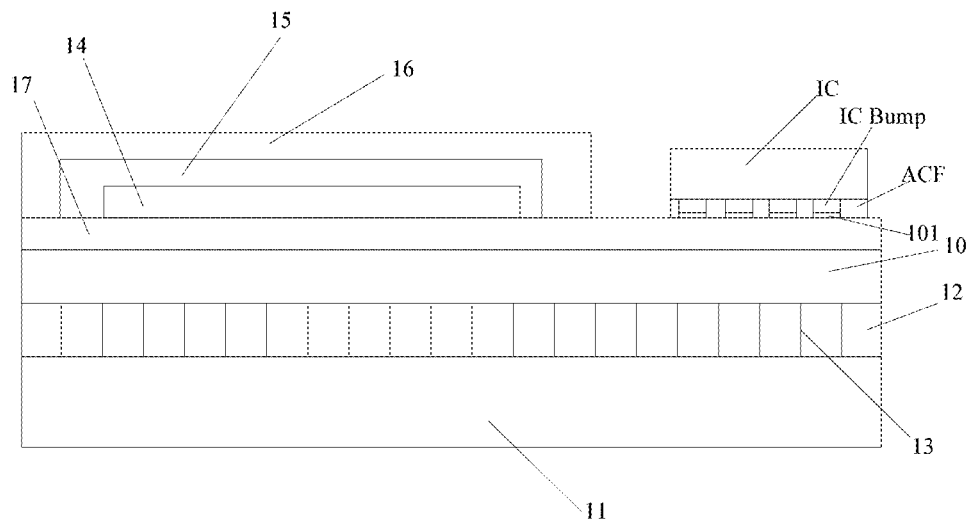

FIG. 2a is a top view of a flexible display panel provided by an embodiment of the present disclosure; FIG. 2b is a cross-sectional view along A-A' in FIG. 2a. As shown in FIGS. 2a and 2b, the flexible display panel comprises: a flexible substrate 10; a back protective film 11 formed on a back surface of the flexible substrate 10; an adhesive layer 12 arranged between the flexible substrate 10 and the back protective film 11; a support structure 13 arranged in the adhesive layer 12 between the flexible substrate 10 and the back protective film 11 and in a position corresponding to each IC bump, the support structure being configured to support the IC bump in the adhesive 12. For example, the "corresponding to" refers to that the orthographic projection of the IC bump on the substrate 10 is substantially fall in the orthographic projection of the support structure 13 on the substrate 10.

In the present embodiment, since the support structure 13 is arranged corresponding to a position of each IC bump on the back surface of the flexible substrate, the support structure 13 having a certain height can provide some support when IC bonding is heated and pressurized; in this way, the adhesive can not flow out under pressure, so that the adhesive corresponding to the position of the IC bump can not be squeezed into a depression and no convex may appear in other regions, the flatness is improved after the IC bonding, and poor crimping and disconnection at the edge of the IC is reduced.

In the embodiment, for example, the support structure 13 is supporting bars 131, and the supporting surface of the supporting bars 131 is large, which may greatly provide strong support.

Figure 3:
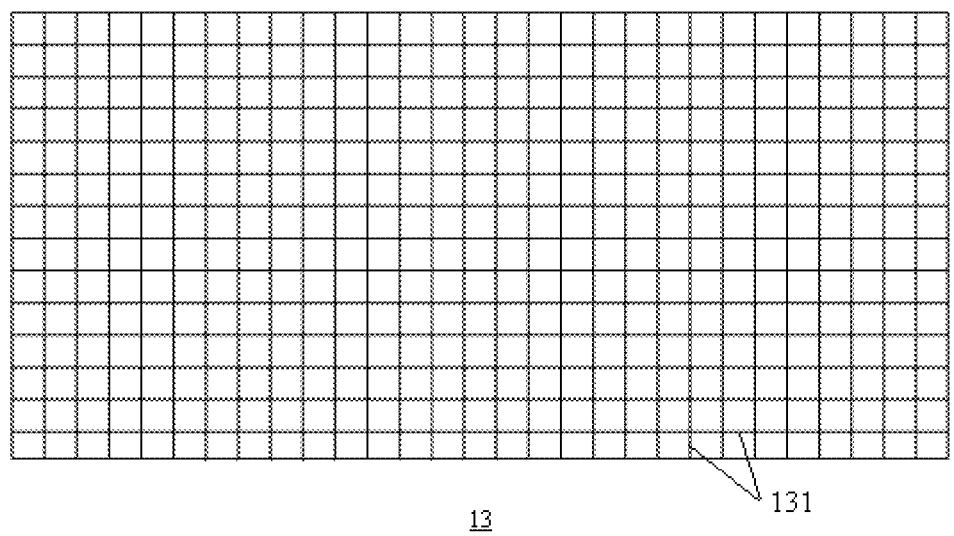
FIG. 3 is a top view of a support structure in FIG. 2b.

For example, for each IC bump, a plurality of supporting bars 131 are provided. The plurality of the supporting bars 131 may be intersected with each other to form a grid structure. As shown in FIG. 3, the support structure uses a grid structure. The grids of the grid structure have the supporting bars 131 in multiple directions, so that the supporting effect is good and stability is good; moreover, the grids of the grid structure may prevent the adhesive from outflow well, which is more conducive to flatness of the display panel. The embodiment of the present disclosure is not limited thereto, for example, in one example, it may adopt that, a plurality of supporting bars 131 are arranged corresponding to each IC bump, but the plurality of the supporting bars 131 are arranged in parallel substantially, which may also provide better and stable supporting force.

Figure 4:
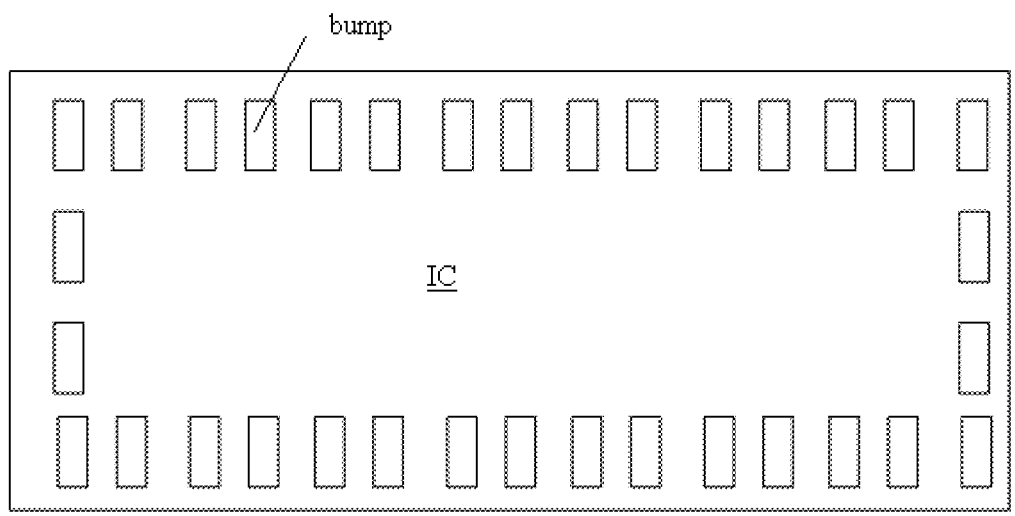
FIG. 4 is a structural schematic diagram of an integrated circuit (IC)
Figure 5:
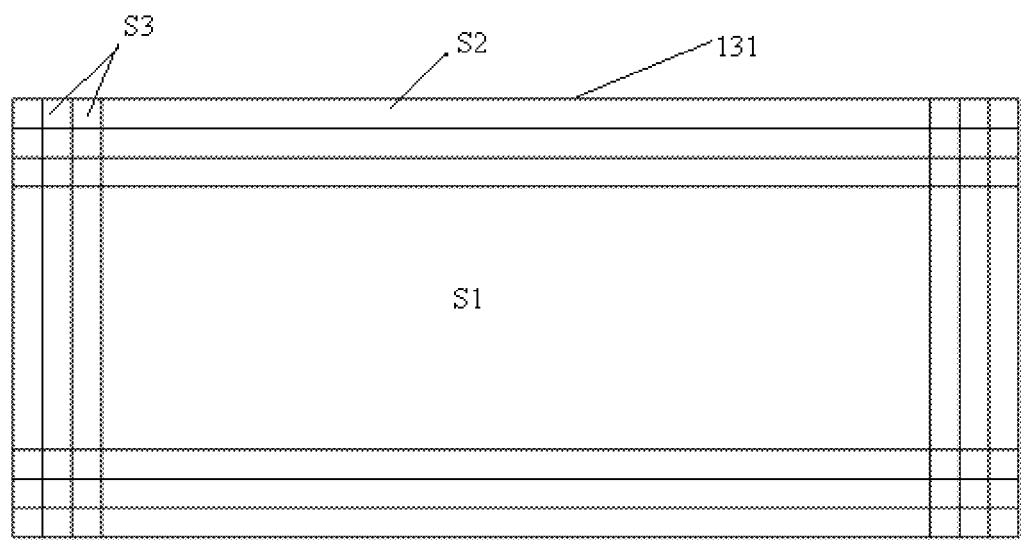
FIG. 5 is a structural schematic diagram of a support structure in the case shown in FIG. 4 for replacing the support structure in FIG. 2a-b.

As shown in FIG. 3, an entire layer of grid structure is formed between the flexible substrate 10 and the back protective film 11 by the supporting bars 131, and the size of each grid of the entire layer of grid structure is same; in this way, the process of preparation is relatively simple, for example, it is require to arrange a grid only in a position of the IC bump. The present disclosure is not limited thereto, and for example, the grids of the entire layer of grid structure may also be inconsistent in size, and it is only required that a size of a grid corresponding to each IC bump can support a pressure applied to the position, and there is no limit to a size of a grid corresponding to a position of non-IC Bump. As shown in FIG. 4 and FIG. 5, no bump is arranged in a center region of the IC in FIG. 4, and therefore, a grid S1 in a center region in FIG. 5 is largest, grids S3 in four corner regions are smallest, and grids S2 in other regions are of middle size. In this case, the support structure 13 is a grid structure in the four corner regions, and the support structure 13 is a plurality of parallel supporting bars 131 in the other regions.

Figure 6:
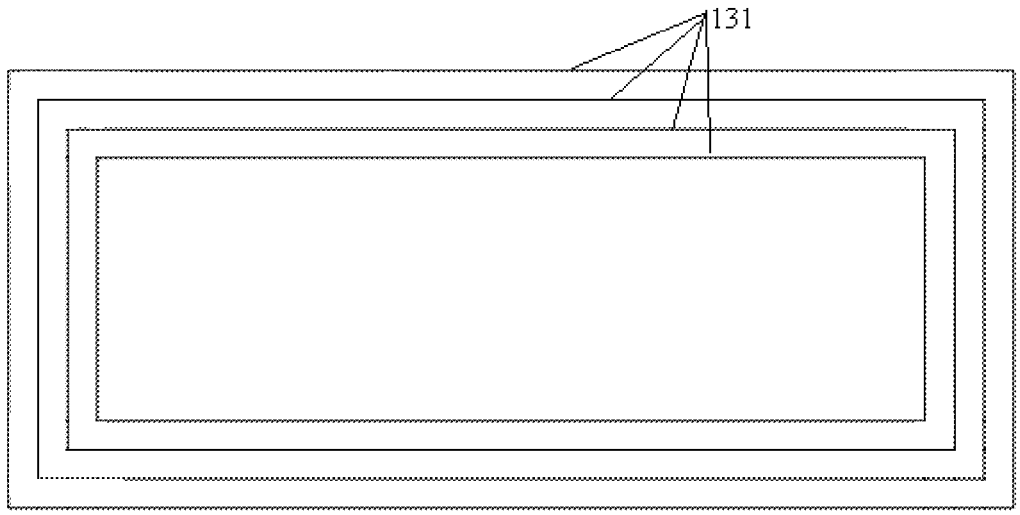
FIG. 6 is a structural schematic diagram of another support structure in the case shown in FIG. 4 for replacing the support structure in FIG. 2a-b.

In addition, for example, in a case where a plurality of IC bumps are arranged along a pattern separately (e.g., a quadrangle shown in FIG. 4), the supporting bars 131 are arranged along a pattern as shown in FIG. 6.

Further, for example, as shown in FIG. 6, a plurality of supporting bars 131 are provided, and the plurality of the supporting bars 131 are arranged in parallel substantially, so that a supporting force is increased.

In one example, each supporting bar 131 may also include a plurality of sub-supporting bars intersected with each other. As shown in FIG. 6, each supporting bar 131 includes two horizontal sub-supporting bars and two vertical supporting bars, and every two adjacent supporting bars 131 intersect at connections. A plurality of sub-supporting bars of at least one supporting bar 131 intersected with each other extend and intersect with at least one supporting bar 131, to form a grid at the intersecting region, as shown in FIG. 5.

It should be noted that, in the embodiment, the support structure 13 is formed by using but not limited to one of inkjet printing process, dripping process, or screen printing process.

It should also be noted that, in the embodiment, the pattern is a quadrangle (including a rectangle, a square, and an irregular quadrangle), but the embodiment of the present disclosure is not limited thereto. For example, the pattern may also be a closed shape, such as a triangle, a polygon, a circle, an ellipse, or other non-closed shape, such as a U-shape, a T-shape and the like.

It should also be noted that, as shown in FIG. 2b, the flexible display substrate may also include: a buffer layer 17 arranged on the flexible substrate 10, a functional layer 14 arranged on the buffer layer 17. For example, it may also include a TFT, an organic light-emitting layer and a metal electrode layer, a thin film packaging layer 15 and a protective film 16.

Embodiment II

Figure 7:
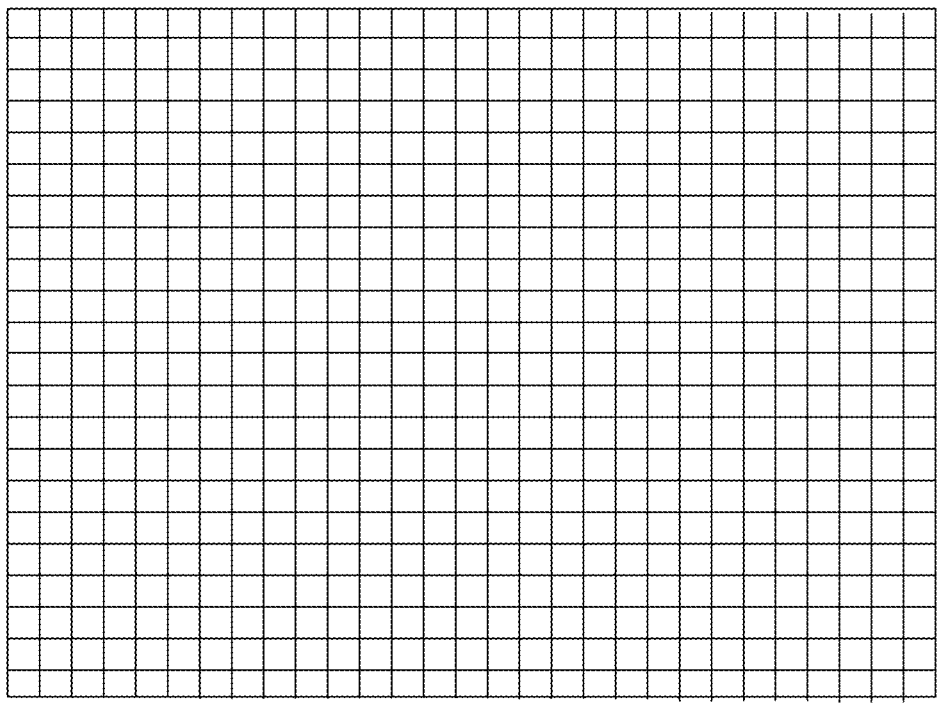
FIG. 7 is a top view of the support structure of a whole substrate in a case of FIG. 2a-b.
Figure 8:
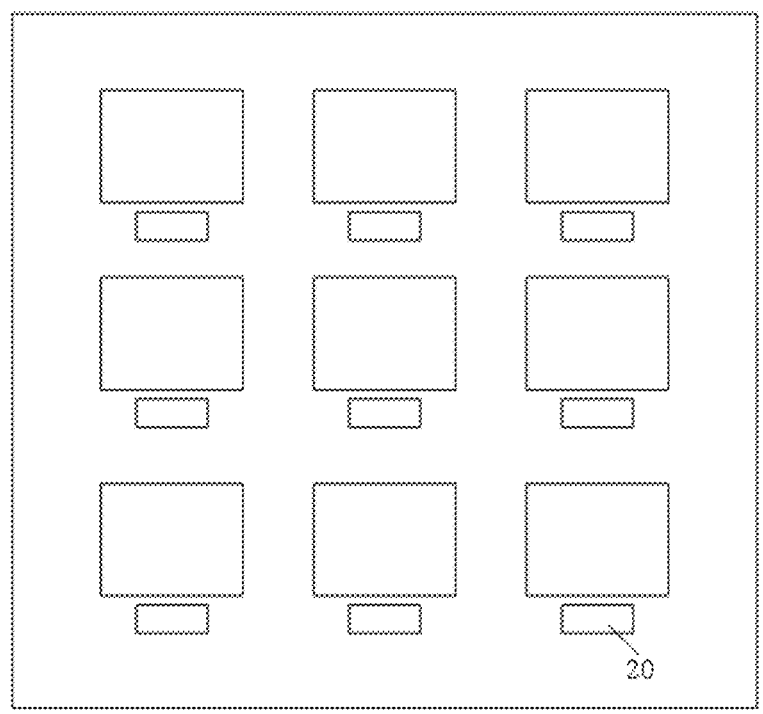
FIG. 8 is a schematic diagram of a binding region of the whole substrate.
Figure 9:
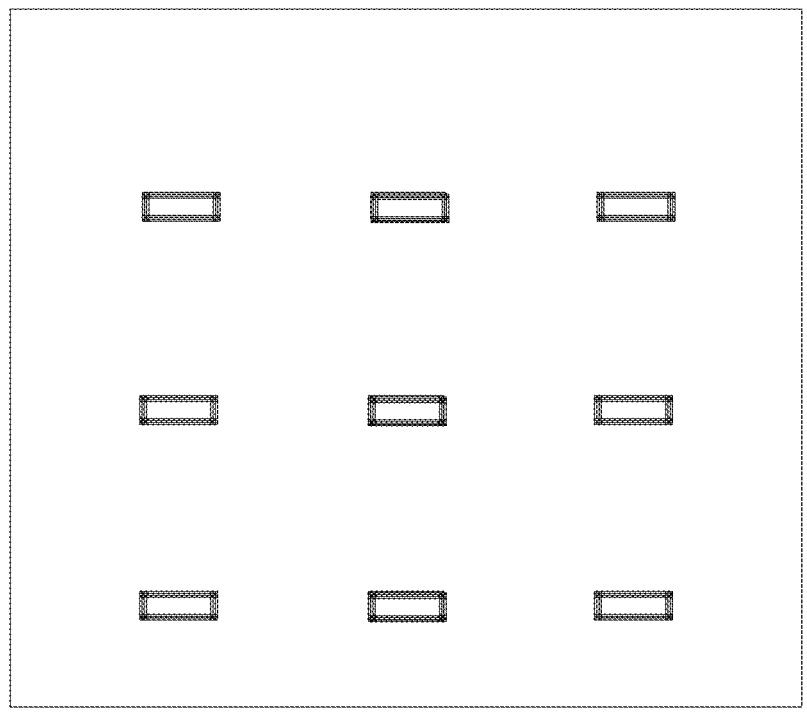
FIG. 9 is a top view of the support structure of the whole substrate in cases of FIGS. 5 and 8.

An embodiment of the present disclosure provides a preparation method of the flexible display panel provided in Embodiment I. For example, for a panel that has completed a front-panel technology, a rigid substrate, such as glass substrate, is removed at first; next, a support structure 13 is prepared on a back surface of the flexible substrate 10, as shown in FIGS. 7 and 9 and referring to FIG. 2b; then, a back protective film 11 having an adhesive 12 is pasted; next, a cutting process is performed, to cut a whole substrate or a mother board of a substrate into a plurality of panels; next, an anisotropic conductive film (ACF) adhesive is pasted to a bonding region 20 of each panel, for example, the adhesive includes conductive particles; next, an integrated circuit (IC) is picked up and placed on the ACF adhesive to be heated and pressurized for bonding, in which the conductive particles are crushed under heating and pressure, to connect the bump with the metal wire 101 on the flexible substrate 10, and the bonding region of the whole substrate is shown in FIG. 8.

Embodiment III

A preparation method of a flexible display panel provided by an embodiment of the present disclosure is similar to that of Embodiment II, and a difference is that: a back protective film including a support structure and adhesive is prepared at first, and the support structure corresponds to a position of each IC Bump; and the back protective film is pasted to the back surface of the flexible substrate. For example, the preparation method may include forming a support structure on a back protective film; applying an adhesive layer on the support structure; procuring the adhesive layer to form an adhesive tape-like layer; and pasting the adhesive tape-like layer on a flexible substrate.

Embodiment IV

An embodiment of the present disclosure also provides a flexible display device, comprising the flexible display panel provided in Embodiment I.

The flexible display device may further comprise other devices, for example, a structure for rolling up and storing the flexible display panel.

The flexible display device provided by the embodiment of the present disclosure includes the flexible display panel provided by Embodiment I, so that the quality of the flexible display device can be improved.

It should be understood that the foregoing embodiments are only exemplary embodiments of the present disclosure for explaining the principle of the present disclosure; however, the present disclosure is not limited thereto. A person of ordinary skill in the art can make various changes and modifications without departing from the spirit of the present disclosure, and such changes and modifications also fall into the scope of the present disclosure.

What is claimed is:

1. A flexible display panel, comprising
a flexible substrate;
a back protective film arranged on a back surface of the flexible substrate;
an adhesive layer between the flexible substrate and the back protective film; and
a support structure including a plurality of supporting bars arranged in the adhesive layer between the flexible substrate and the back protective film and in positions corresponding to integrated circuit bumps, respectively, wherein each of a plurality of the supporting bars is arranged corresponding to one of the integrated circuit bumps in the adhesive layer, and the plurality of the supporting bars includes a first plurality of sub-supporting bars extending along a first direction and a second plurality of sub-supporting bars extending along a second direction intersected with the first direction to allow the first plurality of sub-supporting bars and the second plurality of sub-supporting bars to be intersected with each other to form a grid structure in the adhesive layer, or to allow the first plurality of sub-supporting bars and the second plurality of sub-supporting bars to be adjoined with each other to form a plurality of supporting bar enclosing structures in parallel in the adhesive layer.

2. The flexible display panel according to claim 1, wherein the plurality of the integrated circuit bumps are arranged along a pattern separately, and the plurality of the supporting bars are arranged along the pattern.

3. The flexible display panel according to claim 2, wherein the first plurality of the sub-supporting bars are arranged in parallel substantially, and the second plurality of the sub-supporting bars are arranged in parallel substantially.

4. The flexible display panel according to claim 3, wherein the first plurality of the sub-supporting bars are arranged in parallel substantially, and the second plurality of the sub-supporting bars are arranged in parallel substantially, and intersected with each other to form grids at intersecting regions in corners of the adhesive layer.

5. The flexible display panel according to claim 3, wherein the first plurality of the sub-supporting bars are arranged in parallel substantially, and the second plurality of the sub-supporting bars are arranged in parallel substantially, and intersected with each other to form an entire layer of grid structure in the adhesive layer between the flexible substrate and the back protective film.

6. The flexible display panel according to claim 5, wherein each grid of the entire layer of grid structure has a same size.

7. A preparation method of the flexible display panel according to claim 1, comprising:
forming the back protective film including the support structure and the adhesive layer, the support structure being formed in a position corresponding to each of the integrated circuit bumps; and
pasting the back protective film on the back surface of the flexible substrate.

8. The preparation method according to claim 7, further comprising,
forming the support structure on the back protective film;
applying the adhesive layer on the support structure;
procuring the adhesive layer to form an adhesive tape-like layer; and
pasting the adhesive tape-like layer on the flexible substrate.

9. The preparation method according to claim 7, wherein the support structure is formed by one of inkjet printing process, dripping process, or screen printing process.

10. A preparation method of the flexible display panel according to claim 1, comprising:
forming the support structure on a back surface of the flexible substrate, the support structure being formed in a position corresponding to each of the integrated circuit bumps; and
pasting the back protective film with the adhesive layer on the back surface of the flexible substrate provided with the support structure.

11. A flexible display device, comprising a flexible display panel, wherein the flexible display panel comprises,
a flexible substrate;
a back protective film arranged on a back surface of the flexible substrate;
an adhesive layer between the flexible substrate and the back protective film; and
a support structure including a plurality of supporting bars arranged in the adhesive layer between the flexible substrate and the back protective film and in positions corresponding to integrated circuit bumps, respectively, wherein each of a plurality of the supporting bars is arranged corresponding to one of the integrated circuit bumps in the adhesive layer, the plurality of the supporting bars includes a first plurality of sub-supporting bars extending along a first direction and a second plurality of sub-supporting bars extending along a second direction intersected with the first direction to allow the first plurality of sub-supporting bars and the second plurality of sub-supporting bars to be intersected with each other to form a grid structure in the adhesive layer, or to allow the first plurality of sub-supporting bars and the second plurality of sub-supporting bars to be adjoined with each other to form a plurality of supporting bar enclosing structures in parallel in the adhesive layer.

12. The flexible display device according to claim 11, wherein the first plurality of the sub-supporting bars are arranged in parallel substantially, and the second plurality of the sub-supporting bars are arranged in parallel substantially, and intersected with each other to form grids at intersecting regions in corners of the adhesive layer.

13. The flexible display device according to claim 11, wherein the first plurality of the sub-supporting bars are arranged in parallel substantially, and the second plurality of the sub-supporting bars are arranged in parallel substantially, and intersected with each other to form an entire layer of grid structure in the adhesive layer between the flexible substrate and the back protective film.

14. The flexible display device according to claim 13, wherein each grid of the entire layer of grid structure has a same size.

* * * * *